(12) United States Patent
Kato et al.

(10) Patent No.: US 8,493,426 B2
(45) Date of Patent: *Jul. 23, 2013

(54) LIGHT SOURCE DEVICE AND MANUFACTURING METHOD THEREOF

(75) Inventors: Ryota Kato, Nagoya (JP); Yasuo Tamaru, Nagoya (JP); Jun Mihara, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/292,298

(22) Filed: Nov. 9, 2011

(65) Prior Publication Data

US 2012/0056969 A1 Mar. 8, 2012

Related U.S. Application Data

(63) Continuation of application No. 11/843,308, filed on Aug. 22, 2007, now Pat. No. 8,059,148.

(30) Foreign Application Priority Data

Aug. 23, 2006 (JP) ................................. 2006-227130

(51) Int. Cl.
*B41J 2/45* (2006.01)
(52) U.S. Cl.
USPC ........................................................ 347/238
(58) Field of Classification Search
USPC ................. 347/230, 238, 241–245, 256–261, 347/263
See application file for complete search history.

(56) References Cited

U.S. PATENT DOCUMENTS

| 4,878,066 A | 10/1989 | Shiraishi |
| 4,907,017 A | 3/1990 | Azuma |
| 4,962,983 A | 10/1990 | Watanabe |
| 5,470,892 A | 11/1995 | Gupta et al. |
| 5,999,345 A | 12/1999 | Nakajima et al. |

(Continued)

FOREIGN PATENT DOCUMENTS

| JP | 63-172204 | 7/1988 |
| JP | 5-163037 | 6/1993 |

(Continued)

OTHER PUBLICATIONS

U.S. Official Action dated Jan. 28, 2011 in related,U.S. Appl. No. 11/843,355.

(Continued)

*Primary Examiner* — Hai C Pham
(74) *Attorney, Agent, or Firm* — Scully, Scott, Murphy & Presser, PC (57) ABSTRACT

A light source device and an exposure device are disclosed. A light source device includes: a semiconductor laser; a coupling lens; a holder; a sheet-metal member and a photopolymerizable resin. The coupling lens converts laser light from the semiconductor laser to a light flux. The coupling lens has an optical axis. The sheet-metal member holds the semiconductor laser and the coupling lens. The photopolymerizable rein is cured to fix the coupling lens on the sheet-metal member.

An exposure device for forming an electrostatic latent image by scanning light on a photosensitive body includes: a light source device having a semiconductor laser; a coupling lens, a sheet-metal member and a photopolymerizable resin, a deflector and a scanning lens.

12 Claims, 4 Drawing Sheets

U.S. PATENT DOCUMENTS

| | | | |
|---|---|---|---|
| 6,181,363 B1 * | 1/2001 | Satoh | 347/238 |
| 6,343,092 B1 * | 1/2002 | Naoe et al. | 372/108 |
| 6,502,960 B2 * | 1/2003 | Naoe et al. | 362/259 |
| 6,661,551 B2 * | 12/2003 | Takase | 359/206.1 |
| 7,141,517 B2 | 11/2006 | Kawaguchi et al. | |
| 7,295,225 B2 * | 11/2007 | Ohsugi | 347/244 |
| 7,837,361 B2 | 11/2010 | Santoro et al. | |
| 8,059,148 B2 * | 11/2011 | Kato et al. | 347/242 |
| 2008/0050151 A1 | 2/2008 | Kato et al. | |

FOREIGN PATENT DOCUMENTS

| | | |
|---|---|---|
| JP | 6-164829 | 6/1994 |
| JP | 9-218368 | 8/1997 |
| JP | 11095078 | 4/1999 |
| JP | 11-231237 | 8/1999 |
| JP | 11-160640 | 9/1999 |
| JP | 11-281904 | 10/1999 |
| JP | 2002-31773 | 1/2002 |
| JP | 2002-277791 | 9/2002 |
| JP | 2003-186375 | 7/2003 |
| JP | 2004-047573 | 2/2004 |
| JP | 2004-158586 | 6/2004 |
| JP | 2004-158784 | 6/2004 |
| JP | 2006-184778 | 7/2006 |
| JP | 2006-349839 | 12/2006 |
| JP | 2008-51978 | 3/2008 |

OTHER PUBLICATIONS

U.S. Official Action dated Aug. 25, 2010 in related, U.S. Appl. No. 11/843,355.

Japanese Office Action mailed May 10, 2011 in corresponding Japanese Patent Application No. 2006-227133, together with an English language translation.

U.S. Office Action mailed Nov. 27, 2009 in parent case, U.S. Appl. No. 11/843,308.

U.S. Office Action mailed Jun. 9, 2010 in parent case, U.S. Appl. No. 11/843,308.

U.S. Office Action mailed Sep. 16, 2010 in parent case, U.S. Appl. No. 11/843,308.

* cited by examiner

LIGHT SOURCE DEVICE AND MANUFACTURING METHOD THEREOF

CROSS REFERENCE TO RELATED APPLICATION

This application is a continuation of U.S. patent application Ser. No. 11/843,308, filed on Aug. 22, 2007, which claims priority of Japanese Patent Application No. 2006-227130, filed on Aug. 23, 2006, the entire contents of each of which are incorporated herein by reference.

TECHNICAL FIELD

The present invention relates to a light source device and a manufacturing method thereof, as well as an exposure device and an image forming device using the light source device.

BACKGROUND

In an image forming device such as a laser printer and a digital copier, a laser beam scans a photosensitive body in correspondence with data of an image to be printed. Thereby an electrostatic latent image is formed on the photosensitive body. Then, the image forming device forms an image by supplying developer to the electrostatic latent image, transferring the image to a recording sheet and fixing the image on the sheet.

The image forming device is required to be downsized and low-priced in recent years. In accordance therewith, a light source device that irradiates the laser beam for forming the electrostatic latent image is also required to have a small size and a simple structure, while high accuracy in a product is also required.

The light source device includes a semiconductor laser and a coupling lens (or also called a collimating lens) that gathers the laser light emitted from the semiconductor laser and converts the laser light to a light flux. These two members are positioned with their optical axes being aligned with each other with high accuracy.

Japanese Patent Application Laid-Open Publication No. Hei-11-231237 (which will be referred to as Document 1 hereinafter) discloses, in its FIG. 1, a light source device in which a laser holder that holds a semiconductor laser and a lens holder that holds a coupling lens are prepared separately. The semiconductor laser and the coupling lens are fixed on the respective holders, and the holders are fixed after being positioned corresponding to each other. The lens holder is formed in a cylindrical shape so as to surround the whole circumference of the lens.

Japanese Patent Application Laid-Open Publication No. 2002-31773 (which will be referred to as Document 2 hereinafter) discloses, in its FIG. 2, another light source device that has a more simplified configuration in comparison with the configuration described above. The light source device described in Document 2 uses a holder (holding member) that is formed by integrating a part (main part) for holding the semiconductor laser and a part for holding the coupling lens. The part for holding the coupling lens is in a base shape that protrudes from the main part of the holder in front thereof. After the semiconductor laser is fixed on the holder, the coupling lens is fixed with photopolymerizable or light-curing resin on the base portion of the holder in front of the semiconductor laser. It is noted that the photopolymerizable resin is provided not only between the coupling lens and the base, but also a part of the photopolymerizable resin protrudes outside from between the coupling lens and the base both on the front and rear sides of the coupling lens. Japanese Patent Application Laid-Open Publication No. Hei-9-218368 (which will be referred to as Document 3 hereinafter) discloses, in its FIG. 1, a case where the photopolymerizable resin is provided only between the coupling lens and the base.

SUMMARY

When the coupling lens is relatively thick, the lens can be sufficiently fixed by a method in which the photopolymerizable resin is provided only between the coupling lens and the holder as proposed in Document 3.

In addition, when the coupling lens is relatively thin, the lens can be fixed firmly by bonding the lens with the base not only at an outer peripheral surface of the lens, but also at the front and rear surfaces of the lens in a manner that a part of the photopolymerizable resin protrudes out from between the peripheral surface of the lens and the holder to the front and rear sides of the lens. It is noted that the front surface of the lens is defined as the surface of the lens from which the laser light exits, while the rear surface of the lens is defined as the other surface of the lens into which the laser light enters.

When the coupling lens is fixed on the base-shaped part of the holder as described in Document 2, the lens needs to be held in air by a robot hand with respect to the base. Therefore, irradiating an a curing light, such as an ultraviolet ray, for curing the photopolymerizable resin from directly above the coupling lens is difficult. However, if the ultraviolet ray is irradiated from the front (a side where the laser light exits) of the coupling lens, the ultraviolet ray does not strike on the part of the photopolymerizable resin that protrudes to the rear side of the coupling lens due to refraction of the light at the lens. For this reason, there is a problem that the photopolymerizable resin is not cured, or a large amount of time is required for the curing.

In such a case where the photopolymerizable resin cannot be cured evenly at a time, there is a possibility that the coupling lens moves due to contraction of the photopolymerizable resin while the photopolymerizable resin cures. Thereby, accuracy of the light source device may be lowered.

In view of the above, an object of the present invention is to provide a light source device with simple structure and high accuracy and a manufacturing method thereof, and an exposure device and an image forming device that employ the light source device.

In order to attain the above and other objects, the invention provides a light source device, including: a semiconductor laser; a coupling lens; a holder; and a photopolymerizable resin. The coupling lens converts laser light from the semiconductor laser to a light flux, the coupling lens having a first side and a second side opposite to the first side, the coupling lens having an outer peripheral surface connecting the first side and the second side. The holder holds the semiconductor laser and the coupling lens in a manner that the first side of the coupling lens confronts the semiconductor laser. A part of the photopolymerizable resin is provided between the outer peripheral surface of the coupling lens and the holder and another remaining part of the photopolymerizable resin protrudes from between the outer peripheral surface of the coupling lens and the holder in a direction defined from the first side to the second side, the photopolymerizable resin being cured to fix the coupling lens on the holder.

According to another aspect, the present invention provides an exposure device for forming an electrostatic latent image by scanning light on a photosensitive body, the exposure device including: a light source device that emits laser light; a cylindrical lens that focuses the laser light emitted from the light source device; a deflector that reflects the laser light that has passed through the cylindrical lens, thereby deflecting the laser light to scan in a main scanning direction; and a scanning lens that images on the photosensitive body the laser light that has been deflected to scan by the deflector. The light source device includes: a semiconductor laser; a coupling lens that converts laser light from the semiconductor laser to a light flux, the coupling lens having a first side and a second side opposite to the first side, the coupling lens having an outer peripheral surface connecting the first side and the second side; a holder that holds the semiconductor laser and the coupling lens in a manner that the first side of the coupling lens confronts the semiconductor laser; and a photopolymerizable resin, a part of the photopolymerizable resin being provided between the outer peripheral surface of the coupling lens and the holder and another remaining part of the photopolymerizable resin protruding from between the outer peripheral surface of the coupling lens and the holder in a direction defined from the first side to the second side, the photopolymerizable resin being cured to fix the coupling lens on the holder.

According to another aspect, the present invention provides an image forming device for forming an image on a recording sheet, the image forming device including: an exposure device that forms an electrostatic latent image by scanning light on a photosensitive body; the photosensitive body on which the electrostatic latent image is formed by the exposure device; a developing unit that supplies developer on the photosensitive body; and a transfer member that transfers an image formed by the developer onto a recording sheet. The exposure device includes: a light source device that emits laser light; a cylindrical lens that focuses the laser light emitted from the light source device; a deflector that reflects the laser light that has passed through the cylindrical lens, thereby deflecting the laser light to scan in a main scanning direction; and a scanning lens that images on the photosensitive body the laser light that has been deflected to scan by the deflector, thereby forming an electrostatic latent image on the photosensitive body. The light source device includes: a semiconductor laser; a coupling lens that converts laser light from the semiconductor laser to a light flux, the coupling lens having a first side and a second side opposite to the first side, the coupling lens having an outer peripheral surface connecting the first side and the second side; a holder that holds the semiconductor laser and the coupling lens in a manner that the first side of the coupling lens confronts the semiconductor laser; and a photopolymerizable resin, a part of the photopolymerizable resin being provided between the outer peripheral surface of the coupling lens and the holder and another remaining part of the photopolymerizable resin protruding from between the outer peripheral surface of the coupling lens and the holder in a direction defined from the first side to the second side, the photopolymerizable resin being cured to fix the coupling lens on the holder.

According to another aspect, the present invention provides a method for manufacturing a light source device that includes a semiconductor laser, a coupling lens that converts laser light from the semiconductor laser to a light flux, the coupling lens having a first side and a second side opposite to the first side, a holder that holds the semiconductor laser and the coupling lens in a manner that the first side of the coupling lens confronts the semiconductor laser, and a photopolymerizable resin that fixes the coupling lens on the holder, the method including: providing the photopolymerizable resin on a holder at its area that extends from a first position to a second position; locating a coupling lens, which has a first side and a second side opposite to the first side and an outer peripheral surface connecting the first side and the second side, on the photopolymerizable resin to allow the first position to be located between the holder and either one of the first side of the coupling lens and the outer peripheral surface of the coupling lens and to allow the second position to be located away from the second side of the coupling lens in a direction defined from the first side to the second side; and irradiating the photopolymerizable resin with a curing light for curing the photopolymerizable resin from a position that is away from the second side of the coupling lens in the direction defined from the first side to the second side.

BRIEF DESCRIPTION OF THE DRAWINGS

The particular features and advantages of the invention as well as other objects will become apparent from the following description taken in connection with the accompanying drawings, in which.

DETAILED DESCRIPTION

A light source device, an exposure device and an image forming device according to an embodiment of the invention will be described while referring to the accompanying drawings wherein like parts and components are designated by the same reference numerals to avoid duplicating description.

Figure 1:
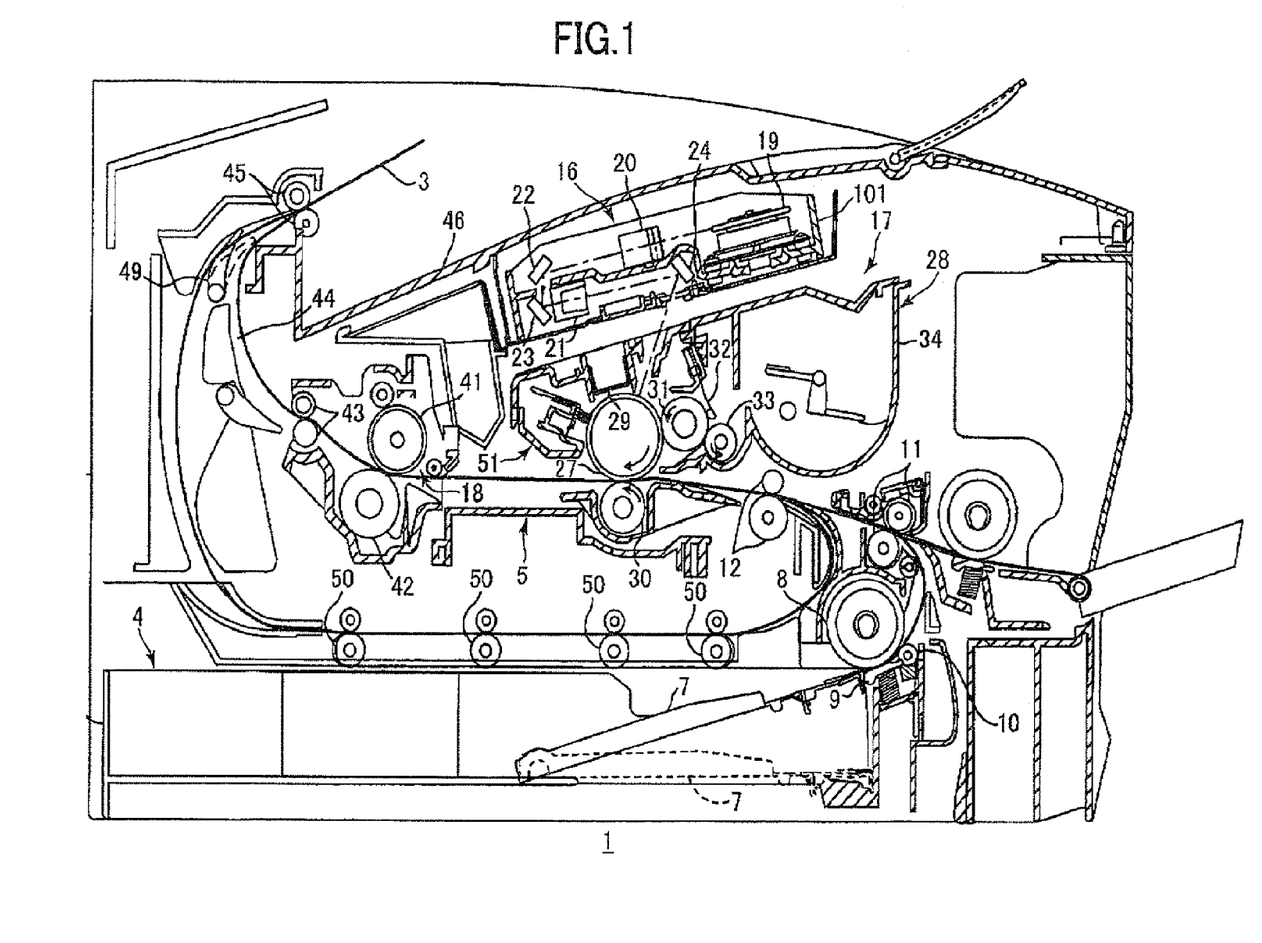
FIG. 1 is a cross-sectional side view of a laser printer according to an embodiment of the present invention.
Figure 2:
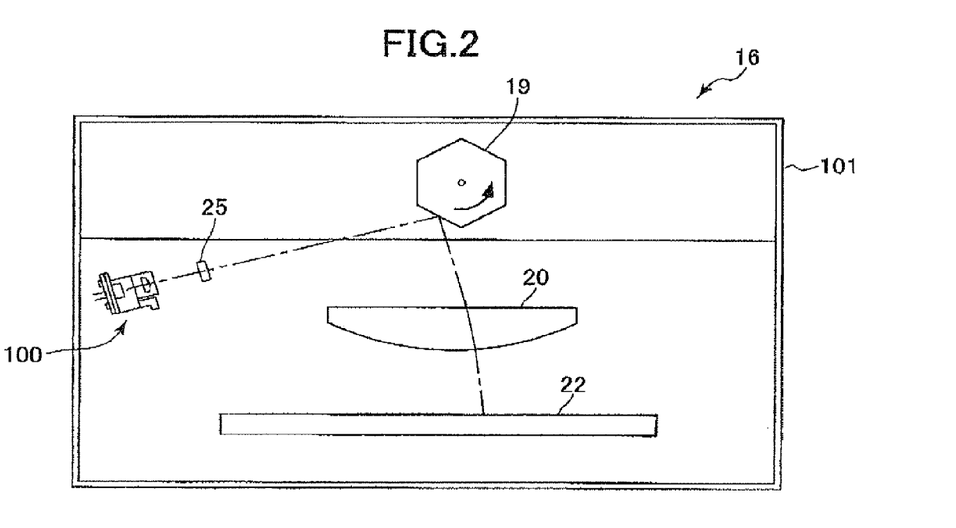
FIG. 2 is a plan view of a scanner unit provided in the laser printer of FIG. 1.

FIG. 1 is a cross-sectional side view of a laser printer 1 according to the embodiment. FIG. 2 is a plan view of a scanner unit 16 provided in the laser printer 1.

The laser printer 1 includes a main casing 2. The laser printer 1 further includes: a feeder section 4 and an image forming section 5. The feeder section 4 and the image forming section 5 are housed in the main casing 2. The feeder section 4 supplies sheets 3 (recording medium) one sheet at a time to the image forming section 5. The image forming section 5 forms a desired image on the supplied sheet 3 based on print data.

The feeder section 4 includes: a paper supply tray 6, a paper pressing plate 7, a sheet supply roller 8, a separating pad 9, paper dust removing rollers 10 and 11, and registration rollers 12. The paper supply tray 6 is detachably mounted in the bottom section of the main casing 2. The paper pressing plate 7 is disposed inside the paper supply tray 6.

In the feeder section 4, a stack of sheets 3 mounted in the paper supply tray 6 are pressed against the sheet supply roller 8 by the paper pressing plate 7. One sheet at a time is separated from the sheet stack by the sheet supply roller 8 and the separating pad 9, and passes the various rollers 10-12, before being conveyed to the image forming section 5.

The image forming section 5 includes: the scanner unit 16, a process cartridge 17, and a fixing section 18.

The scanner unit 16 is provided in an upper part of the main body casing 2. As shown in FIG. 2, the scanner unit 16 includes a light source device 100, a cylindrical lens 25, a polygon mirror 19, an fθ lens 20, and a reflecting mirror 22.

The light source device 100 is for emitting laser light modulated according to print data. The cylindrical lens 25 gathers or focuses laser light emitted from the light source device 100 in a sub-scanning direction, while guiding the laser light to fall incident on the polygon mirror 19, thereby correcting an optical face tangle error of the polygon mirror 19. The polygon mirror 19 has a mirror formed on each side of a hexagon. While rotating, the polygon minor 19 reflects the laser light which has passed through the cylindrical lens 25. Thereby, the mirror 19 deflects and scans the laser light in a main scanning direction. The fθ lens 20 converts the laser light which has been made to scan at an equal angular velocity by the polygon minor 19 so that the laser light scans at a uniform velocity, while imaging the laser light on a surface of a photosensitive drum 27 to be described later.

In addition, the scanner unit 16 includes a correction lens 21, reflecting minors 23 and 24, as shown in FIG. 1, that serve to direct the laser light, which has been directed toward a lower direction by the reflecting mirror 22, to the photosensitive drum 27.

Each of the members described above is appropriately mounted in a case 101.

The configuration of the light source device 100 will be described more in detail later.

The process cartridge 17 is disposed below the scanner unit 16 in the main casing 2, and can be detached from the main casing 2. The process cartridge 17 includes a casing 51, in which the process cartridge 17 has a development cartridge 28, the photosensitive drum 27, a scorotron charge unit 29, and a transfer roller 30.

The development cartridge 28 is detachable from the casing 51, and is provided with a developing roller 31, a layer thickness regulating blade 32, a supply roller 33, and a toner box 34.

The toner box 34 is filled with toner with a positively charging nature. Rotation of the supply roller 33 supplies the developing roller 31 with toner from the toner box 34. At this time, the toner is triboelectrically charged to a positive charge between the supply roller 33 and the developing roller 31. Then, as the developing roller 31 rotates, the toner supplied onto the developing roller 31 moves between the developing roller 31 and the layer thickness regulating blade 32. This further triboelectrically charges the toner, and reduces thickness of the toner on the surface of the developing roller 31 down to a thin layer of uniform thickness.

The photosensitive drum 27 is disposed in confrontation with the developing roller 31. The photosensitive drum 27 is supported rotatably in the casing 51. The photosensitive drum 27 includes a drum-shaped member and a surface layer. The drum-shaped member is electrically grounded. The surface layer is formed from a photosensitive layer that is made from polycarbonate and that has a positively charging nature.

The scorotoron charge unit 29 is disposed above the photosensitive drum 27 and is spaced away from the photosensitive drum 27 by a predetermined space so as to avoid direct contact with the photosensitive drum 27. The scorotron charge unit 29 is a positive-charge scorotron type charge unit for generating a corona discharge from a charge wire made from, for example, tungsten. The scorotoron charge unit 29 forms a blanket of positive-polarity charge on the surface of the photosensitive drum 27.

The transfer roller 30 is rotatably supported at a position below and in confrontation with the photosensitive drum 27. The transfer roller 30 is rotatably supported in the casing 51. The transfer roller 30 includes a metal roller shaft and a roller portion covering the roller shaft. The roller portion is made from conductive rubber material. In order to perform a transfer operation, the transfer roller 30 is applied with a transfer bias according to a constant current control.

As the photosensitive drum 27 rotates, the scorotoron charge unit 29 first forms a blanket of positive charge on the surface of the photosensitive drum 27, and then the surface of the photosensitive drum 27 is exposed to high speed scan of the laser beam from the scanner unit 16. The electric potential of the positively charged surface of the photosensitive drum 27 drops at positions exposed to the laser beam. As a result, an electrostatic latent image is formed on the photosensitive drum 27 based on print data.

Next, an inverse developing process is performed. That is, as the developing roller 31 rotates, the positively-charged toner borne on the surface of the developing roller 31 is brought into contact with the photosensitive drum 27. Because a developing bias voltage is applied to the developing roller 27, the toner on the developing roller 31 is supplied to lower-potential areas of the electrostatic latent image on the photosensitive drum 27. As a result, the toner is selectively borne on the photosensitive drum 27 so that the electrostatic latent image is developed into a visible toner image.

The visible toner image borne on the surface of the photosensitive drum 27 confronts the transfer roller 30 and is transferred onto a sheet 3 as the sheet 3 passes between the photosensitive drum 27 and the transfer roller 30.

The fixing section 18 includes a heating roller 41, a pressure roller 42 applying pressure to the heating roller 41, and transport rollers 43. In the fixing section 18, the toner, which has been transferred to the sheet 3 by the process cartridge 17, is thermally transferred onto the sheet 3 while the sheet 3 passes through between the heating roller 41 and the pressure roller 42. Thereafter, the sheet 3 is transferred to a sheet discharging path 44 by the transport rollers 43. The sheet 3 transported to the sheet discharging path 44 is conveyed to discharge rollers 45. When the discharge rollers 45 rotate forwardly, the discharge rollers 45 discharge the sheet 3 onto a discharge tray 46. When the discharge rollers 45 rotate in reverse and a flapper 49 is swung from the orientation shown in solid line to the orientation shown in broken line in FIG. 3, the sheet 3 is fed back to the inside of the main casing 2 and is fed back to the upstream side of the image forming section 5 by a plurality of inversion transport rollers 50. At this time, the upper and lower surfaces of the sheet 3 are reversed from the first time that an image has been formed on the sheet 3 so that an image can be formed on the other side as well. In this way, images are formed on both sides of the sheet 3.

Figure 3:
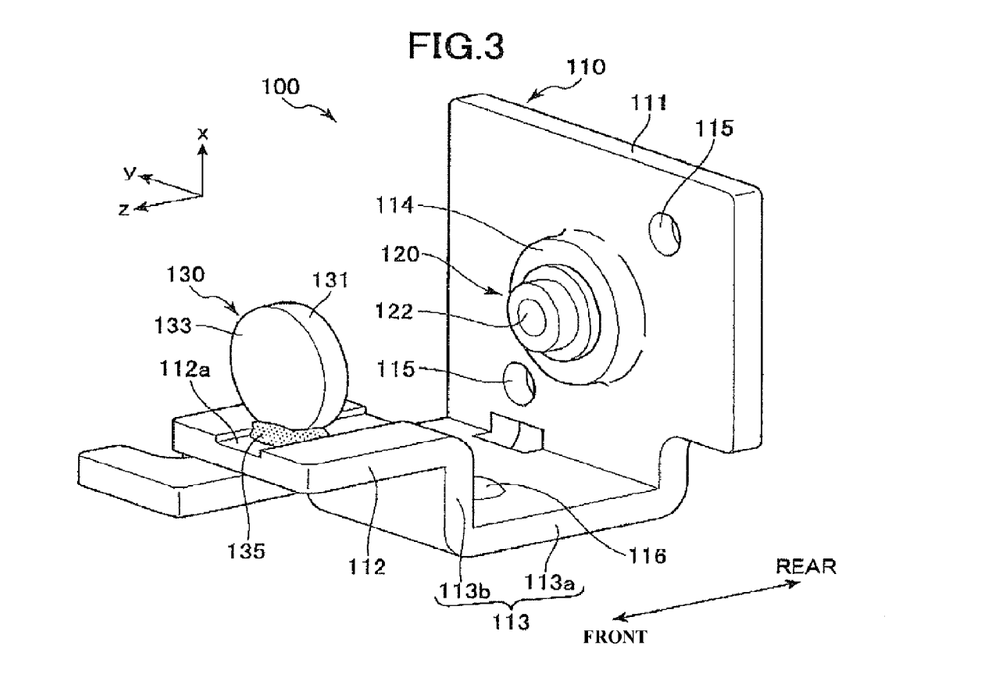
FIG. 3 is a perspective view of a light source device provided in the scanner unit of FIG. 2.
Figure 4:
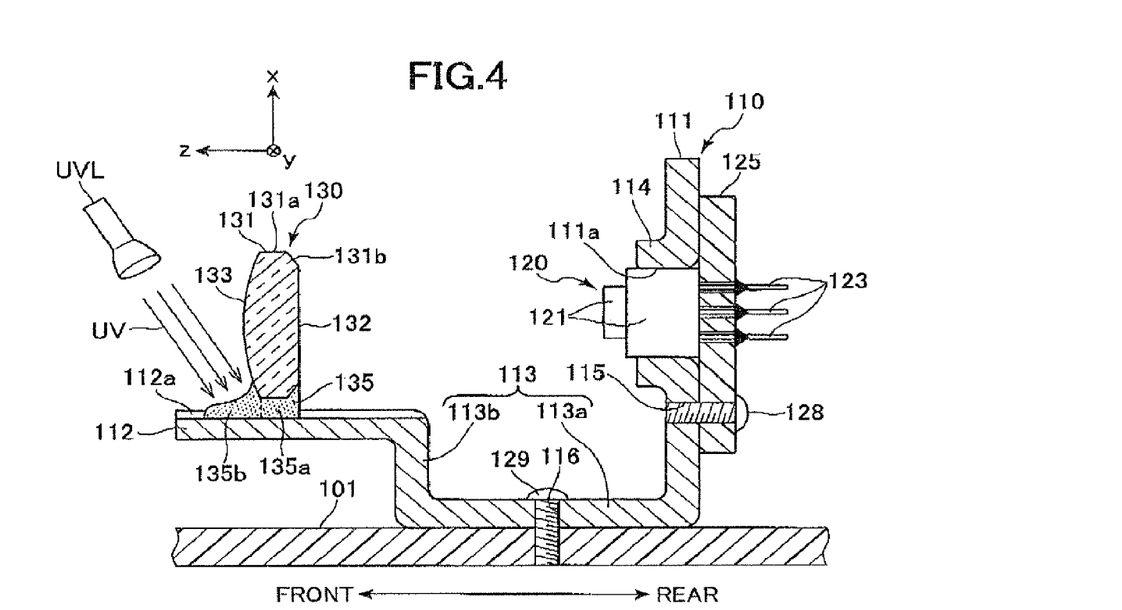
FIG. 4 is a cross-sectional view of the light source device of FIG. 3.

FIG. 3 is a perspective view of the light source device 100. FIG. 4 is a cross-sectional view of the light source device 100.

As shown in FIG. 3, the light source device 100 includes a holder 110. A semiconductor laser 120 and a coupling lens 130 are fixed on the holder 110. The semiconductor laser 120 is for emitting light that is modulated according to the print data.

The holder 110 is obtained by carrying out a sheet-metal processing on a plate material made of aluminum alloy or aluminum.

The holder 110 includes a laser holding wall 111, a lens holding part 112, and a connecting part 113. The semiconductor laser 120 is fixed on the laser holding wall 111. The lens holding part 112 is of a base shape, and the coupling lens 130 is fixed on the base-shaped lens holding part 112. The connecting part 113 connects the laser holding wall 111 and the lens holding part 112 with each other.

The laser holding wall 111 has a mounting through-hole 111a having a circular shape. The mounting through-hole 111a is formed on the center of the laser holding wall 111. The mounting through-hole 111a is formed by penetrating the laser holding wall 111 so that the semiconductor laser 120 can fit therein (refer to FIG. 4). An edging 114 projecting toward a front side (direction in which the laser light of the semiconductor laser 120 is emitted) is formed on an edge of the mounting through-hole 111a. The edging 114 forms a tube part, in which the semiconductor laser 120 fits. In addition, the laser holding wall 111 has two screw through-holes 115 provided thereon. The screw through-holes 115 are used for fixing the semiconductor laser 120 (refer to FIG. 3) on the laser holding wall 111.

The lens holding part 112 is located distant from the laser holding wall 111 for a predetermined distance in a front direction. A groove 112a extending in a front-back direction is formed on a top surface of the lens holding part 112, that is, a surface on which the coupling lens 130 is mounted. Photopolymerizable or light-curing resin 135 that serves as adhesive for fixing the coupling lens 130 on the lens holding part 112 is provided in the groove 112a. That is, by applying the photopolymerizable resin 135 in the groove 112a in a manner that the resin 135 stays in the groove 112a, the resin is prevented from flowing away from the lens 130 in a direction perpendicular to the front-back direction. The groove 112a can also serve as a reference position, on which the photopolymerizable resin 135 is to be applied.

The holder 110 is preferably made of metal. For example, the holder 110 is made of aluminum or aluminum alloy. In this manner, a top surface of the lens holding part 112 is capable of reflecting light for curing the photopolymerizable resin 135. By reflecting light on the surface of the lens holding part 112, the curing of the photopolymerizable resin 135 can be accelerated. The holder 110 may be made of other material that can reflect off light.

The connection part 113 includes a bottom wall part 113a and a front wall part 113b. The bottom wall part 113a extends in a front direction from a bottom edge of the laser holding wall 111. The front wall part 113b extends vertically so as to connect a front edge of the bottom wall part 113a and a rear edge of the lens holding part 112. The bottom wall part 113a has a screw through-hole 116 formed thereon. The screw through-hole 116 is used for fixing the holder 110 on the case 101 of the scanner unit 16.

The semiconductor laser 120 is a known device including a package 121 as an outer packaging and an aperture 122 formed on the package 121. A light emitting element (not shown) is provided in the inside of the package 121. The laser light is emitted from the semiconductor laser 120 through the aperture 122. As shown in FIG. 4, the semiconductor laser 120 is pressed and fixed in the mounting through-hole 111a. The semiconductor laser 120 has terminals 123. The terminals 123 pass through through-holes formed in a printed circuit board 125 and are connected to a circuit (not shown). The print circuit board 125 is fixed to the laser holding wall 111 by fastening screws 128 in the screw through-holes 115.

The coupling lens 130 is for gathering the laser light emitted from the semiconductor laser 120 and converts the laser light to a light flux (bundle of light). The coupling lens 130 is located distant from the semiconductor laser 120 by a distance that is determined dependently on a focal length of the lens 130. The coupling lens 130 is bonded with and fixed on the lens holding part 112 by the photopolymerizable resin 135.

The photopolymerizable resin 135 is provided between the coupling lens 130 and the holder 110, or more particularly, between the coupling lens 130 and the lens holding part 112. A part of the photopolymerizable resin 135 protrudes from between the coupling lens 130 and the lens holding part 112 to the front side of the coupling lens 130. However, no part of the photopolymerizable resin 130 protrudes from between the coupling lens 130 and the lens holding part 112 to a rear side of the coupling lens 130. That is, no photopolymerizable resin 130 is provided on the rear side of a rear surface 132 of the coupling lens 130.

In other words, the photopolymerizable resin 130 is provided on the lens holding part 112 so that the photopolymerizable resin 135 has a main part 135a that is located between the coupling lens 135 and the lens holding part 112 and a front protruding part 135b that protrudes forwardly from the main part 135a.

More specifically, the coupling lens 130 has a pair of optical surfaces 132 and 133 and an outer peripheral surface 131. The pair of optical surfaces 132 and 133 includes: the rear surface 132 and a front surface 133. The laser light from the semiconductor laser 120 passes through the pair of optical surfaces 132 and 133. The outer peripheral surface 131 connects the pair of optical surfaces 132 and 133. In this example, the outer peripheral surface 131 has: a main part 131a that extends parallel to the optical axis of the coupling lens 130 and an additional part 131b that extends from the main part 131a toward the rear surface 132 obliquely rearwardly with respect to the optical axis of the coupling lens 130. The rear surface 132 is flat and is perpendicular to the optical axis of the coupling lens 130, while the front surface 133 is curved around the optical axis of the coupling lens 130.

In the photopolymerizable resin 135, the main part 135a is located between the outer peripheral surface 131 of the coupling lens 130 and the lens holding part 112, while the front protruding part 135b protrudes forwardly from the main part 135a. No part of the photopolymerizable resin 130 protrudes rearwardly from the main part 135a.

As apparent from FIG. 4, the coupling lens 130 is fixed at a position away from the lens holding part 112 in the vertical direction (x direction). In this manner, the coupling lens 130 can be fixed on the holder 110 after the position of the lens 130 is adjusted relative to the semiconductor laser 120.

The coupling lens 130 can be made of glass or resin. A material having a thermal expansion coefficient, which is in a range of (½)×C to C, wherein C is the thermal expansion coefficient of a member constituting the holder 110 is preferably selected. By selecting a material having the thermal expansion coefficient close to that of the holder 110 as described above, a change in an optical characteristic of the light source device 100 can be made small even when there is a temperature change.

For example, in a case where aluminum having a thermal expansion coefficient $\alpha H$ of $2.30 \times 10^{-5}$/K is selected as the material of the holder 110 and glass having a thermal expansion coefficient $\alpha L$ of $1.15 \times 10^{-5}$/K is selected as the material of the coupling lens 130, a tilt $\Delta a$ of an optical axis due to a temperature rise of 25 degrees Celsius ($=\Delta T$) is calculated as:

$$\Delta a = a \tan((\beta H - \beta L) \times R \times \Delta T / f) = 0.47'$$

wherein R indicates a radius R of the lens 130 (3 mm, for example), and f indicates a focal length of the lens 130 (6.25 mm, for example).

It is noted that generally, adjustment accuracy of the lens of the light source device 100 is required to be ±5'. Therefore, by selecting glass with material as described above, influence of a temperature rise can be restricted to be sufficiently small. An example of the glass, whose thermal expansion coefficient is in a range between a half of that of aluminum and that of aluminum, is "Super Vidron" (trade name) that has thermal expansion coefficient $\alpha L = 11.8 \times 10^{-5}$/K and that is a molded glass manufactured by Sumita optical glass, Inc.

In addition, the outer peripheral surface 131 of the coupling lens 130 is roughened. So, when the coupling lens 130 is made of glass, the outer peripheral surface 131 is in a ground glass form. When the coupling lens 130 is made of resin, the outer peripheral surface 131 is in a ground resin form. Since the outer peripheral surface 131 is roughened, curing light (ultraviolet ray in the present embodiment) entering inside the coupling lens 130 diffuses adequately on the outer peripheral surface 131. In this manner, the ultraviolet ray falls on the photopolymerizable resin 135 evenly below the coupling lens 130 (between the coupling lens 130 and the holder 110).

The holder 110 is fixed on the case 101 in a manner that a screw 129 is put into the screw through-hole 116 and screwed in the case 101.

With the above-described structure, the coupling lens 130 is fixed on the holder 110 by irradiating an ultraviolet ray UV from the front side of the coupling lens 130. Therefore, the light source device 100 can be manufactured at low cost.

The photopolymerizable resin 135 is entirely cured at a time. In this manner, the coupling lens 130 can be positioned with high accuracy.

In addition, the photopolymerizable resin 135 is cured not only at a position between the outer peripheral surface of the coupling lens 130 and the lens holding part 112 but also at a position between the front side of the coupling lens 130 and the lens holding part 112. In this manner, even in a case where the coupling lens 130 is relatively thin, the lens 130 can be fixed on the holder 110 firmly.

The light source device 100 can be configured at extremely low cost by configuring the holder 110 by carrying out the sheet metal processing on a metal plate. In particular, by adopting aluminum or aluminum alloy as the material of the holder 110, heat dissipation of the holder 110 becomes higher. Thereby, the holder 110 can be made to have a function also as a cooling plate of the semiconductor laser 120.

Next, a manufacturing method of the light source device 100 will be described.

First, the semiconductor laser 120 is pressed and fixed in the laser holding wall 111. Then, the print circuit board 125 is fixed on the laser holding wall 111 with the screws 128.

Then, the holder 110 is fixed on the case 101 of the scanner unit 16 with the screw 129.

Next, the photopolymerizable resin 135 is applied on the groove 112a of the lens holding part 112. The photopolymerizable resin 135 is applied to spread from a position, directly below a position where the coupling lens 130 is assumed to be located, to a slightly front side thereof. In this manner, when the coupling lens 130 is located on the lens holding part 112, the photopolymerizable resin 135 is prevented from protruding out from the position between the coupling lens 130 and the lens holding part 112 to the rear side (side closer to the semiconductor laser 120) of the coupling lens 130. In this state, the photopolymerizable resin 135 is located between the coupling lens 130 and the lens holding part 112, with partly protruding to the front side (exit side of the laser light) of the coupling lens 130.

More specifically, the photopolymerizable resin 135 is applied to spread from a position, directly below a position where the outer peripheral surface 131 of the coupling lens 130 is assumed to be located, to a slightly front side thereof. In this manner, when the coupling lens 130 is located on the lens holding part 112, the photopolymerizable resin 135 is prevented from protruding out from the position between the outer peripheral surface 131 of the coupling lens 130 and the lens holding part 112 to the rear side of the coupling lens 130. In this state, the photopolymerizable resin 135 is located between the outer peripheral surface of the coupling lens 130 and the lens holding part 112, with partly protruding to the front side of the coupling lens 130.

Next, the coupling lens 130 is held by a robot hand (not shown) having multiple spindles. The coupling lens 130 may be held by the robot hand in a manner that the outer peripheral surface 131 of the coupling lens 130 is held or nipped by the robot hand, or the outer peripheral surface 131 or a rim of the front or rear side surface (optical surface) 133, 132 of the coupling lens 130 is vacuum-absorbed by the robot hand. Then, the laser light is emitted from the semiconductor laser 120. While tilt and a focus of the laser light which has passed through the coupling lens 130 are checked by a measuring unit or visual observation, the robot hand is operated to adjust orientation and a position in the x-y direction shown in FIG. 3 or FIG. 4 of the coupling lens 130. Further, in a similar manner, a position in the z direction shown in FIG. 3 or FIG. 4 of the coupling lens 130 is adjusted.

Then, after the position of the coupling lens 130 is fixed, an ultraviolet ray lamp UVL is provided in the front side of the coupling lens 130. By irradiating the ultraviolet ray UV on the photopolymerizable resin 135 from the front side, the photopolymerizable resin 135 is cured. The ultraviolet ray UV is irradiated from the front side of the coupling lens 130. Or, the ultraviolet ray UV may be irradiated obliquely from an upper front side of the coupling lens 130 so that the ultraviolet ray UV strikes on the photopolymerizable resin 135 entirely.

By the operation described above, the coupling lens 130 can be fixed on an ideal position with respect to the semiconductor laser 120. In particular, the photopolymerizable resin 135 is entirely cured by the ultraviolet ray UV that is entirely struck on the photopolymerizable resin 135 even when the ultraviolet ray UV is irradiated from the front side of the coupling lens 130. This is because the photopolymerizable resin 135 is provided between the coupling lens 135 and the holder 110 and partly protrudes on the front side of the coupling lens 130. In addition, as described above, the ultraviolet ray UV which has entered inside the coupling lens 130 is diffused on the outer peripheral surface 131. Then, the ultraviolet ray UV also strikes on the photopolymerizable resin 135 between the coupling lens 130 and the holder 110 evenly. In this manner, an uncured part can be eliminated. Further, the ultraviolet ray UV which has passed through the photopolymerizable resin 135 reflects off the surface of the holder 110, or more particularly, the lens holding part 112, and contributes to the curing of the photopolymerizable resin 135 again. Therefore, the photopolymerizable resin 135 can be prevented from being uncured.

Thus, the coupling lens 130 is firmly fixed on the holder 110. In addition, the photopolymerizable resin 135 is cured at a time. So, accuracy of positioning of the coupling lens 130 can be improved.

Irradiating the ultraviolet ray from the rear side of the coupling lens 130 is difficult due to existence of the laser holding wall 111. However, according to the manufacturing method of the present embodiment, the ultraviolet ray does not need to be irradiated from the rear side of the coupling lens 130, and the light source device 100 can be manufactured easily. By irradiating the ultraviolet ray from the front side of the coupling lens 130, the ultraviolet ray can be irradiated on the photopolymerizable resin 135 entirely without the coupling lens 130 blocking the light.

<Modifications>

Figure 5:
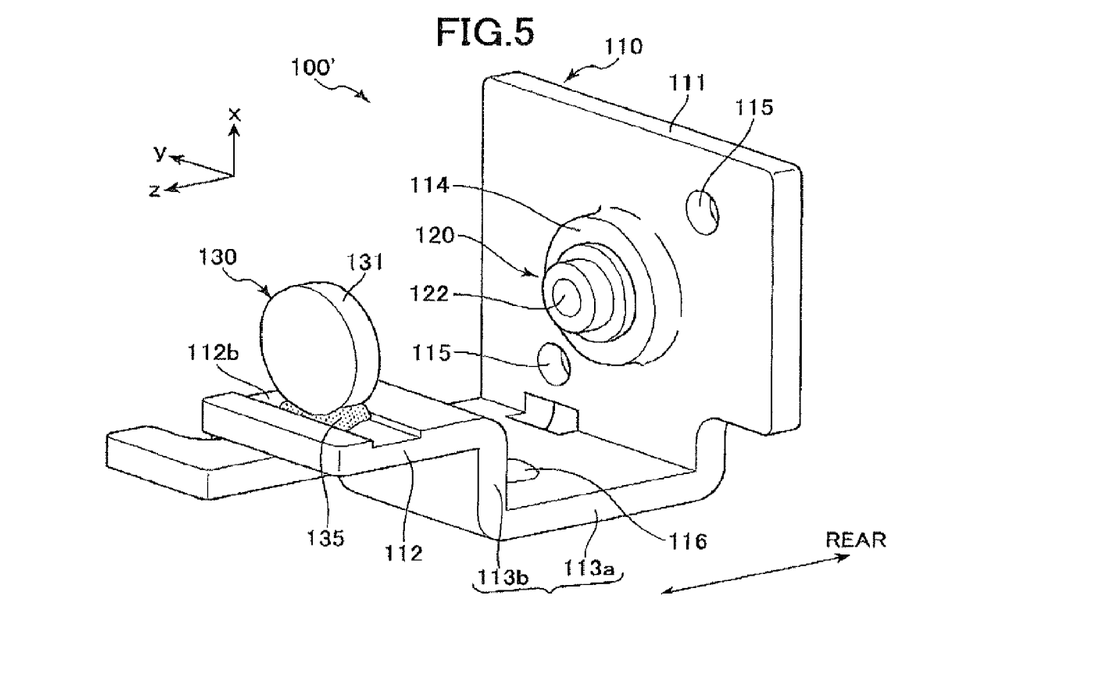
FIG. 5 is a perspective view of a light source device according to a modification.
Figure 6:
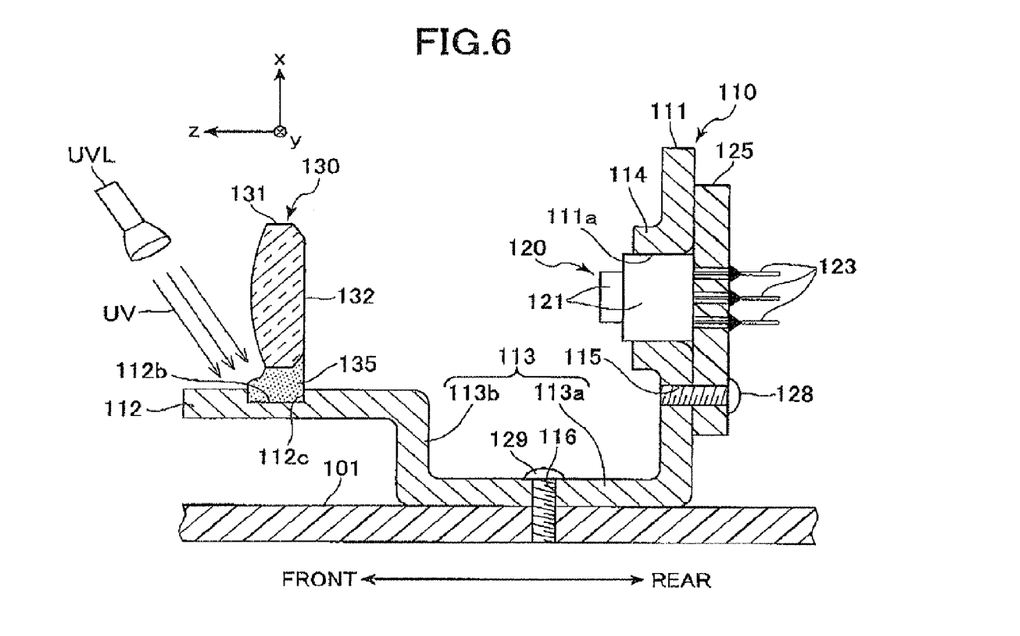
FIG. 6 is a cross-sectional view of the light source device of FIG. 5.

For example, FIG. 5 is a perspective view of a light source device 100' according to a modification. FIG. 6 is a cross-sectional view of the light source device 100'.

As shown in FIG. 5, a light source device 100' has a groove 112b formed on the lens holding part 112 of the holder 110 along a direction (y direction in FIG. 5 or FIG. 6) perpendicular to the front-back direction of the coupling lens 130. The groove 112b has an edge part 112c as a rear edge thereof which is positioned at the same position or slightly in front of the rear surface 132 of the coupling lens 130 along the front-back direction (z direction).

By providing the transverse groove 112b as described above on the lens holding part 112, the photopolymerizable resin 135 is prevented from protruding out to the rear side of the coupling lens 130 when the photopolymerizable resin 135 is applied on the groove 112b. For this reason, the photopolymerizable resin 135 can be applied between the coupling lens 130 and the holder 110, and easily protrudes out only to the front side of the coupling lens 130.

In addition, in the embodiment described above, the robot hand is used to adjust the position and the orientation of the coupling lens 130. However, the position and the orientation of the coupling lens 130 may be adjusted manually while the coupling lens 130 is held by a goniometer.

While the invention has been described in detail with reference to the embodiment and modification thereof, it would be apparent to those skilled in the art that various changes and modifications may be made therein without departing from the spirit of the invention.

For example, he laser printer 1 in the embodiment described above may be modified to other various types of image forming device, such as a copier and a multi-function machine.

The transfer roller 30 in the above embodiment may be modified into a non-contact type transfer roller.

In the above embodiment, the paper 3 such as a cardboard, a postcard, and a thin paper, is used as the recording sheet. However, the laser printer 1 may be modified to print on other various types of recording medium, such as an OHP sheet.

In the embodiment described above, the toner, the developing cartridge 28, the polygon mirror 19, the fθ lens 20, the scanner unit 16, and the photosensitive drum 27 are used as a developer, a developing unit, a deflector, a scanning lens, an exposure device, and a photosensitive body, respectively. However, the materials and the structure of the laser printer 1, such as the developing cartridge 28, the polygon mirror 19, the fθ lens 20, the scanner unit 16, and the photosensitive drum 27, can be appropriately modified.

What is claimed is:

1. A light source device, comprising:
    a semiconductor laser;
    a coupling lens that converts laser light from the semiconductor laser to a light flux, the coupling lens having an optical axis;
    a sheet-metal member that holds the semiconductor laser and the coupling lens, the sheet-metal member including a first bent portion and a second bent portion;
    a photopolymerizable resin cured to fix the coupling lens on the sheet-metal member; and
    a main body;
    wherein the sheet-metal member includes:
        a first portion extending in a first direction perpendicular to the optical axis and holding the semiconductor laser;
        a second portion that extends in a second direction perpendicular to the first direction and is fixed to the main body; and
        a third portion holding the coupling lens, the third portion extending in a third direction that is parallel to the second direction and being disposed at a location different from a location of the second portion in the first direction;
    wherein the first portion and the second portion are connected via the first bent portion, wherein the second portion and the third portion are connected via the second bent portion.

2. The light source device according to claim 1, wherein a distance between the third portion and the optical axis in the first direction is smaller than a distance between the second portion and the optical axis in the first direction.

3. The light source device according to claim 2, further comprising a screw for fixing the second portion to the main body, the screw having a head that is disposed on a side opposite to the main body with respect to the second portion,
    wherein a distance between the head and the optical axis in the first direction is greater than a distance between the third portion and the optical axis in the first direction.

4. The light source device according to claim 1, further comprising a circuit board held by the first portion and electrically connected to the semiconductor laser.

5. The light source device according to claim 1, wherein the sheet-metal member has an opening for press-fitting the semiconductor laser therein.

6. The light source device according to claim 5, wherein the sheet-metal member further has an edging portion formed on an edge of the opening and projecting toward the coupling lens.

7. The light source device according to claim 1, wherein the sheet-metal member is made of aluminum alloy.

8. The light source device according to claim 1, wherein the sheet-metal member is made of aluminum.

9. The light source device according to claim 1, wherein the sheet-metal member is formed with a groove on which the photopolymerizable resin is provided.

10. The light source device according to claim 1, wherein the coupling lens has a thermal expansion coefficient whose value is in a range of $(1/2) \times C$ to $C$, where $C$ indicates a thermal expansion coefficient of a material configuring the sheet-metal member.

11. The light source device according to claim 1, wherein the sheet-metal member is made of metal whose surface is configured to reflect light.

12. An exposure device for forming an electrostatic latent image by scanning light on a photosensitive body, the exposure device comprising:
    a light source device that emits laser light, the light source device, comprising:
        a semiconductor laser;
        a coupling lens that converts laser light from the semiconductor laser to a light flux, the coupling lens having an optical axis;
        a sheet-metal member that holds the semiconductor laser and the coupling lens, the sheet-metal member including a first bent portion and a second bent portion;
        a photopolymerizable resin to fix the coupling lens on the sheet-metal member;
    a main body;
    wherein the sheet-metal member includes:
        a first portion extending in a first direction perpendicular to the optical axis and holding the semiconductor laser;
        a second portion that extends in a second direction perpendicular to the first direction and is fixed to the main body; and
        a third portion holding the coupling lens, the third portion extending in a third direction that is parallel to the second direction and being disposed at a location different from a location of the second portion in the first direction;

wherein the first portion and the second portion are connected via the first bent portion, wherein the second portion and the third portion are connected via the second bent portion;

a deflector that reflects the laser light that has passed through the coupling lens, thereby deflecting the laser light to scan in a main scanning direction; and a scanning lens that images, on the photosensitive body, the laser light that has been deflected to scan by the deflector.

* * * * *